(12) United States Patent
Jiandong (10) Patent No.: US 6,801,058 B1
(45) Date of Patent: Oct. 5, 2004

(54) CIRCUIT AND METHOD FOR OVER-CURRENT SENSING AND CONTROL

(75) Inventor: Jiang Jiandong, The Colony, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/408,531

(22) Filed: Apr. 7, 2003

(51) Int. Cl.[7] .............................................. H03K 5/19
(52) U.S. Cl. ........................................ 327/20; 327/51
(58) Field of Search .......................... 327/18–20, 24–26, 327/51, 379, 427, 434, 437, 108–109, 112; 361/93.1, 93.7, 98

(56) References Cited

U.S. PATENT DOCUMENTS

| | | | |
|---|---|---|---|
| 5,018,041 A | * 5/1991 | Szepesi | 361/18 |
| 5,467,242 A | * 11/1995 | Kiraly | 361/94 |
| 6,169,431 B1 | * 1/2001 | Xu | 327/109 |

* cited by examiner

*Primary Examiner*—My-Trang Nu Ton
(74) *Attorney, Agent, or Firm*—W. Daniel Swayze, Jr.; W. James Brady; Frederick J. Telecky, Jr.

(57) ABSTRACT

The present invention comprises a low side reverse recovery sense circuit (401) and a high side reverse recovery sense circuit (601), of a low side over-current circuit of a power output stage (400) and a high side over-current of a power output stage (600), respectively, operable to sense current through said low side and high side primary circuit and accurately control said current when an over-current threshold is detected while disabling such circuit when a reverse recovery spike is detected.

16 Claims, 10 Drawing Sheets

CIRCUIT AND METHOD FOR OVER-CURRENT SENSING AND CONTROL

FIELD OF THE INVENTION

The present invention generally relates to circuits and methods for sensing current through a primary circuit, such as a power output stage, and accurately controlling said current with any over-current control circuit when over-current is detected, while disabling the over-current control circuit when a pre-determined voltage spike is detected.

BACKGROUND OF THE INVENTION

A switching power output stage typically comprises a circuit with one or more power transistors whose output is controlled by a pulse-width modulated ("PWM") signal. These power outputs stages are often configured as Class D audio power output stages used in systems such as compact disk players, home theatre and stereo amplifiers, DVD players, computers and personal digital assistants. Over-current detection and control is necessary, among other things, in the event the output of a power supply is externally shorted to ground or there is an inadvertent short between the terminals. Transistors used in the power output stages are prone to failure if exposed to excessive current or temperature. An over-current sense circuit detects if the current goes above a threshold limit, and if so, an over-current control circuit shuts down the device to protect the system. In many circuits, particularly switching power output stages, over-current protection is one of the most critical features for product reliability.

There are two conventional methods of over-current sense circuits (i) voltage detection and (ii) direct current detection. In voltage detection, the circuit detects the voltage drop across the power switch, typically a power bipolar junction transistor ("BJT") or power metal oxide semiconductor field effect transistor ("MOSFET"), when the on-resistance of the transistor (also referred to herein as a "switch") is known. The direct current detection method monitors the over-current events directly.

A significant disadvantage with conventional over-current sense methods and circuits arises because of the effect of the reverse recovery of the body diode. The body diode is a parasitic diode that develops across the switch in the process of fabricating an integrated circuit ("IC"). The reverse recovery of the body diode causes the voltage drop across the power switch in the on-state to be higher than the actual voltage drop that is contributed purely by the on-resistance of the switch. In a conventional over-current sense circuit, the duration of the reverse recovery is estimated, and a latency of the same amount is added to the over-current sense circuit. The body diode of the power switch often is not well-controlled in the IC fabrication process and the duration of the reverse recovery can vary from device to device, from wafer to wafer, and from lot to lot. This method often leads to imprecise current control and can result in (i) false over-current detection and circuit shut down or (ii) failure to properly detect over-current resulting in switch failure. The degree of imprecision depends on the fabrication process of the IC.

SUMMARY OF THE INVENTION

The present invention achieves technical advantages as a new current sensing circuit that senses the current through the power switch and the spikes due to the reverse recovery effects of the body diode in real time. The circuit is operable to protect the power output MOSFET switches if an over-current event occurs. In the present invention, a circuit monitors the reverse recovery of the body diode directly (the "reverse recovery sense circuit"), and is able to detect actual over-current events without being subject to the Vrr spike attributable to the body diode. The invention includes a first reverse recovery sense circuit for the low side of the power output stage and a second reverse recovery sense circuit for the high side of the power output stage. Each of the first and second reverse recovery sense circuits have a front end and a back-end. The front end samples the voltage spikes due to reverse recovery effects of the body diode. The back end enables or disables the over-current control circuit in the digital domain with the use of a two-input AND gate. The output of the AND gate is coupled to the over-current control circuit, the over-current control circuit controlling the input of the power output stage. The input signal of the power output stage can be overridden by the over-current control circuit in response to the over-current control circuit. In most cases, the device will shut down if any over-current event is detected.

The present invention accomplishes its objectives using the known parameters of the maximum on-resistance of the power switch and the maximum operation current through the power switch. Based on these parameters, the maximum voltage drop ("Von_max") in the on-state across the power switch is derived. The reverse recovery sense circuit monitors the voltage drop during the on-state across the power switch ("Von"). During the reverse recovery period of the body diode, when the voltage drop Von is greater than the maximum voltage drop Von_max, the over-current detection circuit is disabled even if the over-current sense circuit detects that Von is above the over-current threshold during this time period. When the reverse recovery of the body diode is complete, the voltage drop decreases below the maximum voltage drop Von_max for reverse recovery and the over-current sense circuit is then enabled to protect the device from any over-current event.

An exemplary embodiment of the present invention achieves better precision independent of the IC fabrication process. Advantageously, the components required to implement the present invention occupies a very small chip area on the IC.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

The numerous innovative teachings of the present invention will be described with particular reference to an exemplary embodiment. However, it should be understood that this exemplary embodiment provides only one example of the many advantageous uses and innovative teachings herein. In general, statements made in the specification of the present application do not necessarily delimit any of the various claimed inventions. Moreover, some statements may apply to some inventive features, but not to others. Throughout the drawings, it is noted that the same reference numerals or letters will be used to designate like or equivalent elements having the same function. Detailed descriptions of known functions and constructions unnecessarily obscuring the subject matter of the present invention have been omitted for clarity.

Figure 1:
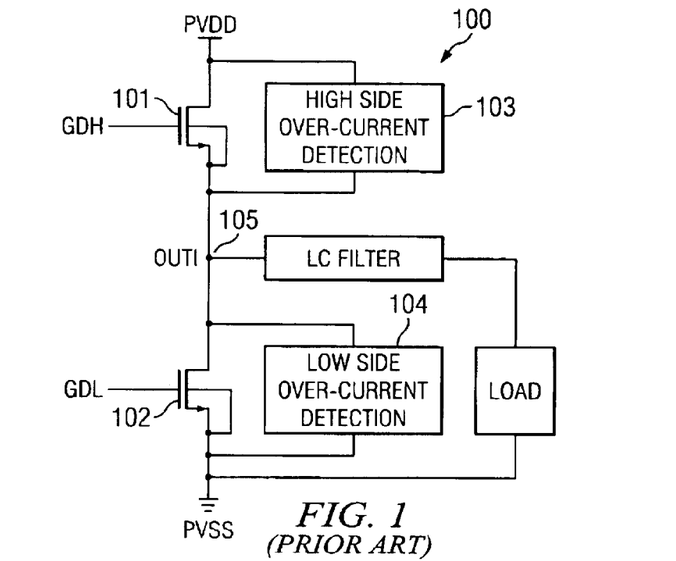
FIG. 1 is a schematic diagram of a conventional switching power output stage with over-current detection circuits for both high side and low side power switches.

There are two types fundamental methods and circuits for over-current detection, voltage type and current type. A voltage type circuit is seen in FIG. 1. As seen in FIG. 1, the current through the output device comprised of power MOS transistor 101 is monitored by high side current detection circuit 103, and the current through the output device comprised of power MOS transistor 102 is monitored through low side current detection circuit 104. Current detection circuits 103 and 104 monitor the drain-to-source voltage ("Vds_on") of the power MOS transistors 101, 102 that is proportional to the output current through node 105. Because the on-resistances of the power MOS transistors 101 and 102 are known, the voltage drop across each MOS transistor Vds_on can be used to sense the output current indirectly. If current detection circuit 103 or 104 detects an over-current event, an over-current error signal is sent to an over-current control circuit that modifies the signal applied to the gates of MOS transistors 101 or 102 as appropriate.

Figure 2A:
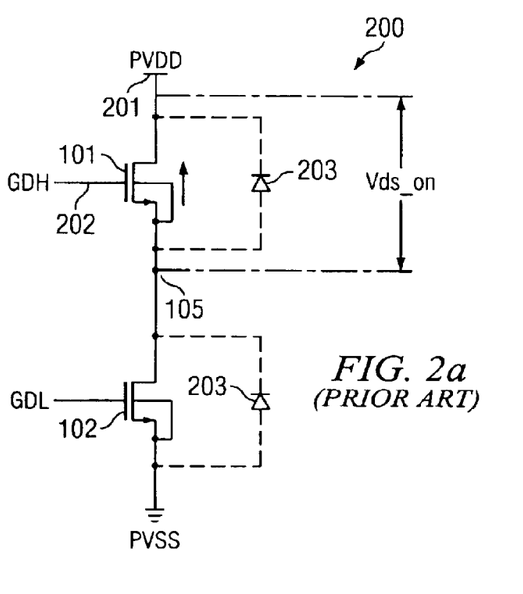
FIG. 2(a) is a schematic diagram of conventional high side switching power output stage with body diodes.
Figure 2B:
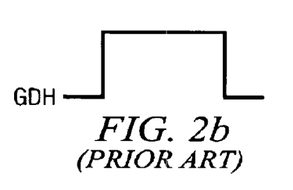
FIG. 2(b) is a representation of the high side gate drive signal introduced to a conventional high side switching power device.
Figure 2C:
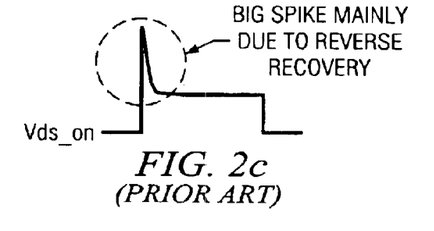
FIG. 2(c) is a representation of the drain-to-source voltage ("Vds_on") waveform from a conventional high side switching power output stage with an over-current sense circuit, illustrating a voltage spike attributable to the reverse recovery of the body diode.

FIG. 2(a) is a schematic diagram of a conventional high side switching power output stage with body diodes 203. Node 202 accepts a signal, shown in FIG. 2(b), that drives power MOS transistor 101. When the low side MOS transistor 102 is off, current can still flow into node 105 due to an output inductor-capacitor filter. Since both MOS transistors 101 and 102 are off to avoid a large shoot-through for a short period of time, this current must flow through the high-side parasitic body diode 203. When high side power MOS transistor turns on, extra charge must be applied at node 201 to reverse bias the parasitic diode 203 until it turns off, and there is a sizable reverse current through the body diode 203 during this period. This is the reverse recovery of the body diode. During the reverse recovery period, a voltage spike is developed across MOS transistor 101, as shown in FIG. 2(c). While the spike is primarily attributable to the reverse recovery of the body diode 203, other factors such as current bouncing and charge injection can also contribute to the spike. The presence of the spike can cause the over-current sense circuit to inadvertently cause the over-current control circuit to shut down the power output stage. Therefore, to account for this spike during over-current detection and monitoring, it is well known in the art to place a delay in the over-current sense circuit to account for spike. This delay virtually turns off the over-current sense circuit or over-current control circuit during the time it is estimated that the spike is present.

Figure 3:
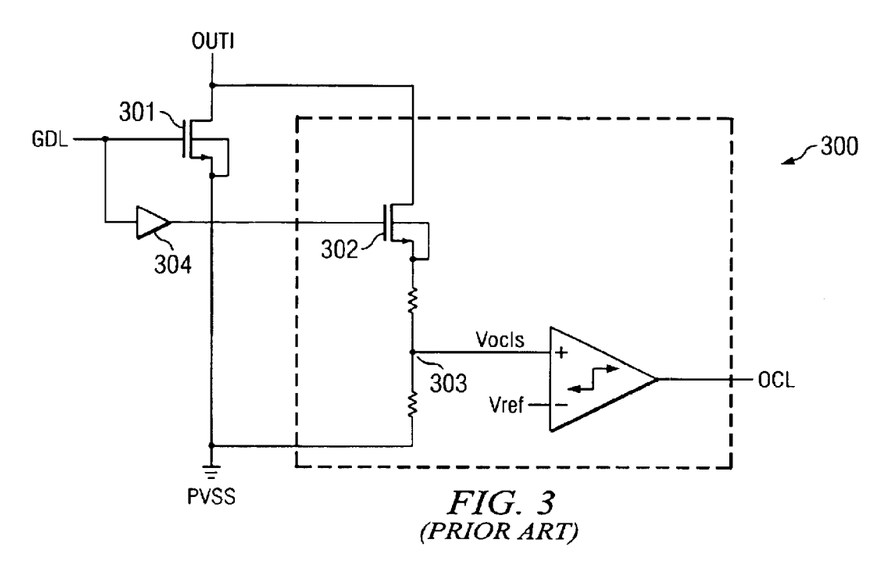
FIG. 3 is a schematic diagram of a conventional low side switching power output stage with an over-current sense circuit.

FIG. 3 is a schematic diagram of the conventional low side switching power output stage with an over-current sense circuit. A delay block 304 can be utilized to turn on the sampling switch 302 after the power MOS transistor 301 is on for the specified time period of the delay. As seen in FIG. 3, if delay block 304, is absent, when MOS transistor 301 turns on, switch 302 also turns on at the same time, and the spike is seen at node 303 ("Vocls"). The voltage at node 303 is compared with the reference voltage ("Vref"), thus the low side current is being monitored. As noted, the disadvantage of the circuit without the delay sampling is that the spike itself may trigger the over-current control circuit to shut down or reduce the input to the power switch. Thus, a delay is introduced to the sampling switch 302 such that the voltage spike is not sensed. But the amount of delay needed cannot be precisely determined in the conventional circuit because the reverse recovery of the body diode is not a well-controlled parameter.

Figure 4:
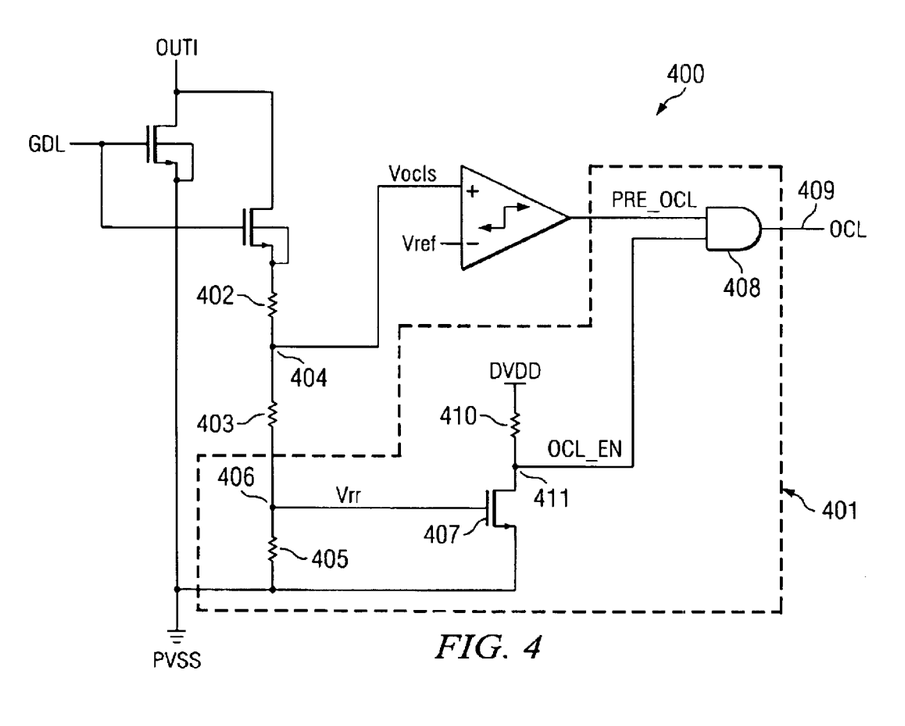
FIG. 4 is a schematic diagram of a low side switching power output stage with an over-current sense circuit and reverse recovery sense circuit of the present invention.

The present invention overcomes the disadvantage of not being able to precisely measure the duration of the reverse recovery of the body diode. Circuit 400, of FIG. 4 is a low side power output stage comprised of transistor MLS, with an over-current sense circuit and a reverse recovery sense circuit 401. The circuit 401 of FIG. 4 comprises the reverse recovery sense circuit of the low side power output stage. Resistors 402, 403 and 405 comprise a voltage divider circuit. The voltage Vocls at node 404 is the sensing voltage for over-current at the low side. Resistor 405 develops reverse recovery threshold voltage Vrr at node 406. Vrr is compared with the known parameter of threshold voltage of an N type MOS transistor 407 ("Vtn"). Resistor 410 and switch 407 form a simple comparator circuit comparing Vrr with Vtn. If Vrr is greater than Vtn, the voltage at node OCL_EN is low. Thus, the output of a logic detection circuit here seen as the logic AND gate 408, is zero, and at the low side over-current reporting signal at node 409 is zero. In other words, the low-side over-current detection circuit is disabled during reverse recovery. If Vrr is less than Vtn, the voltage at node OCL_EN 411 is-high, and the output of the logic detection circuit, i.e., AND gate 408 will be determined by the output of the over-current comparator. Thus over-current is being monitored. In operation, reverse recovery sense circuit 401 disables the over-current detection circuit coupled to node OCL 409 when a reverse recovery spike is present.

Figure 5:
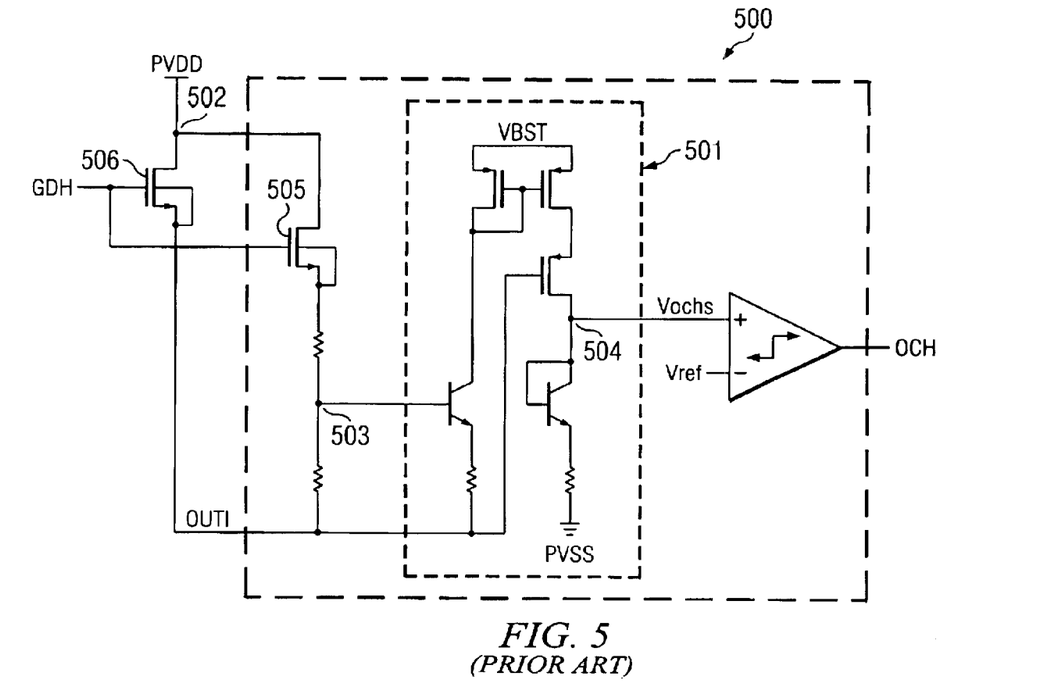
FIG. 5 is a schematic diagram of a conventional high side switching power output stage with an over-current sense circuit.

FIG. 5 is the schematic diagram of the conventional high side switching power output stage 500 with an over-current sense circuit. As seen therein, circuit 501 comprises a level shifter circuit useful for shifting the current sensing voltage level. The reverse recovery spike seen at node 502 is also seen at node 503 and node Vochs 504. MOS transistor 505 is a sampling switch for power MOS transistor 506. In this topology, the current through MOS transistor 506 is being monitored indirectly by sensing the drain-to-source voltage Vds_on. Disadvantageously, this circuit is unable to sense over-current and also disregard the reverse recovery spike attributable to the body diode in real time. This may result in triggering the over-current control circuit which is controlled by the over-current error signal at node 506 in response to the spike.

Figure 6:
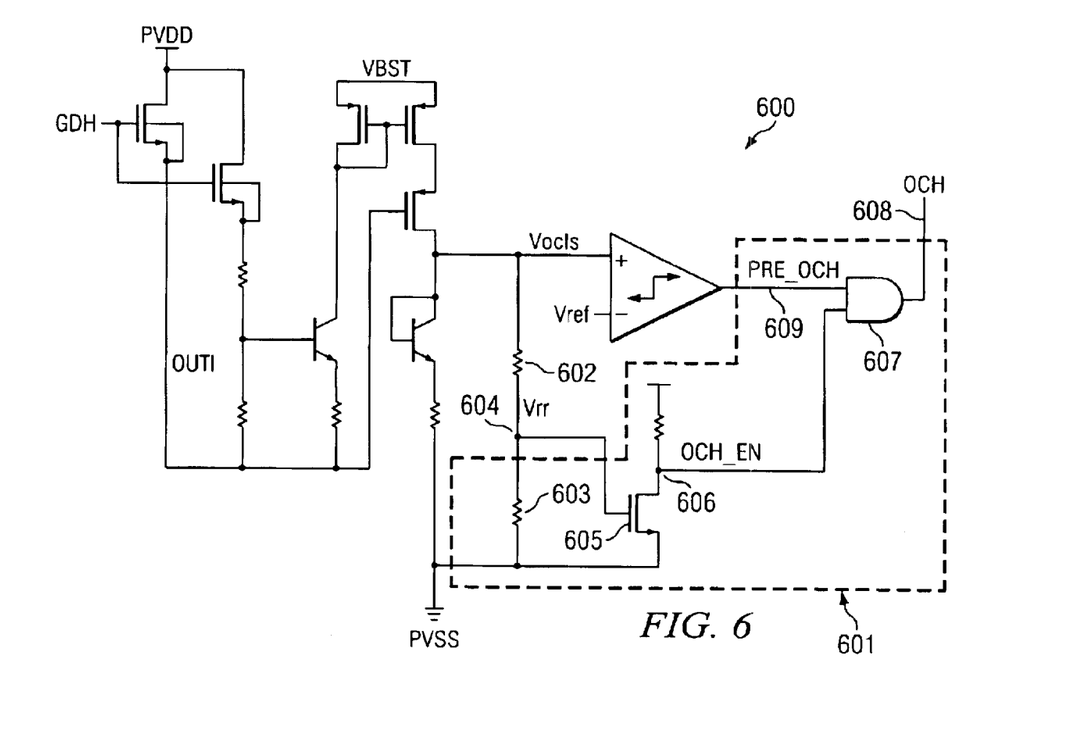
FIG. 6 is a schematic diagram of a high side switching power output stage with an over-current sense circuit and reverse recovery sense circuit of the present invention.

FIG. 6 is a schematic diagram of the high side switching power output stage with an over-current sense circuit and a reverse recovery sense circuit 601 of the present invention. Circuit 601 comprises the reverse recovery sense circuit for the high side power output stage MHS. This circuit is similar to the low side reverse recovery sense circuit 401 as seen in FIG. 4. In FIG. 6, resistor 602 and resistor 603 form a voltage divider. This voltage divider develops the high side reverse recovery sense voltage Vrr at node 604. The processing of signal Vrr at node 604 is similar to the processing of signal Vrr at node 406 of FIG. 4. Vrr is compared with the threshold voltage Vtn of N type MOS transistor 605. If Vrr is higher than Vtn, MOS transistor 605 will be on and pull the voltage at node 606 to PVSS, i.e. logic zero in digital domain. The output of a logic detection circuit, here seen as logic AND gate 607, will be low when Vrr is higher than Vtn of MOS transistor 605, hence the over-current control circuit which is controlled by the over-current signal at node OCH 608 is disabled when the reverse recovery spike is present. When the reverse recovery spike fades away and Vrr is lower than the Vtn of MOS transistor 605, the voltage at node OCH_EN 606 is high, thus the output of the logic detection circuit, AND gate 607, will be determined by the voltage at node PRE_OCH 609. This way, the over-current sensing circuit monitors the output current level without the interference from the reverse recovery spikes.

Figure 7:
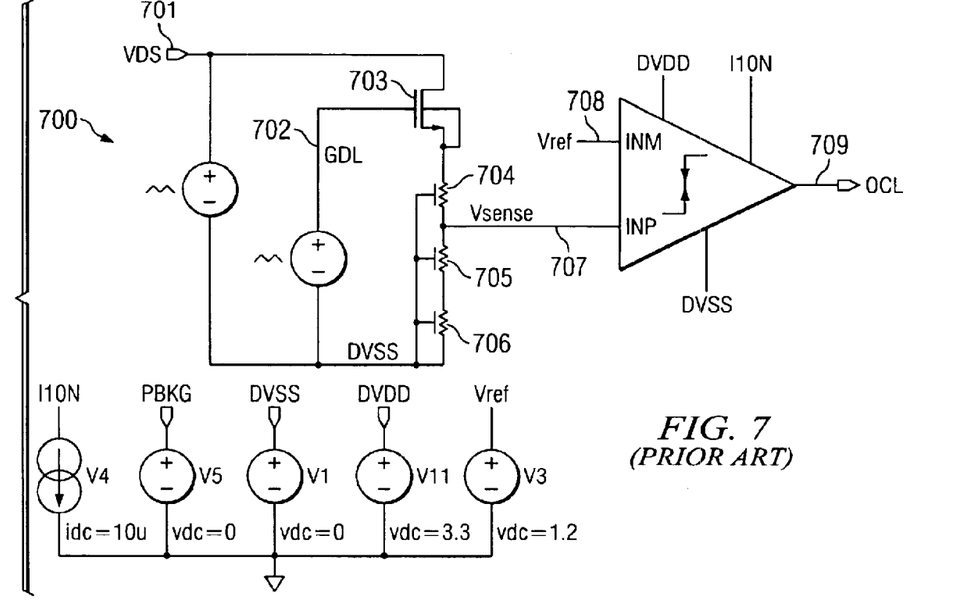
FIG. 7 is a schematic diagram that models a conventional low side switching power output stage with an over-current sense circuit.

FIG. 7 is the schematic diagram which models the conventional low side switching power output stage 700 with an over-current sense circuit. An arbitrary voltage VDS is introduced at node 701 to emulate the reverse recovery spikes during normal switching. The gate drive signal GDL is applied at node 702 to control the gate of the low-side sampling switch 703. Resistors 704, 705 and 706 comprise a voltage divider. The current sense voltage at node 707 is compared with the predetermined reference voltage Vref at node 708. Vref at node 708 is set at 1.2 volts to model the nominal Bandgap voltage. Performing transient analysis in SPICE on circuit 700, the signals at various nodes, as shown on the timing diagram in FIG. 8 are obtained. This circuit demonstrates the inability of such a circuit to disregard voltage spikes in real time.

Figure 8A:
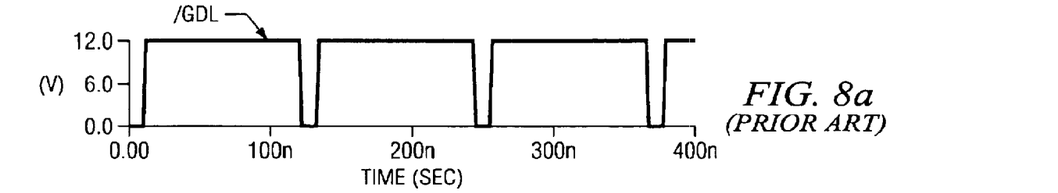
FIGS. 8(a)–(e) comprise waveforms at various nodes in the schematic diagram of FIG. 7 from a spice simulation.
Figure 8B:
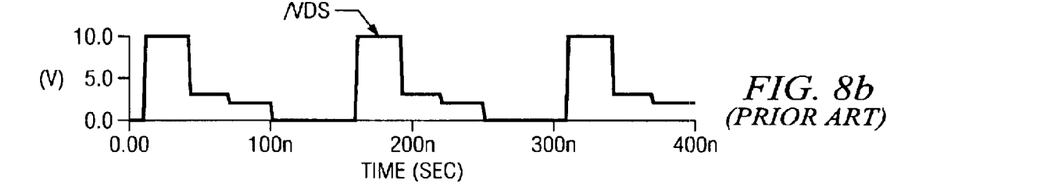
Figure 8C:
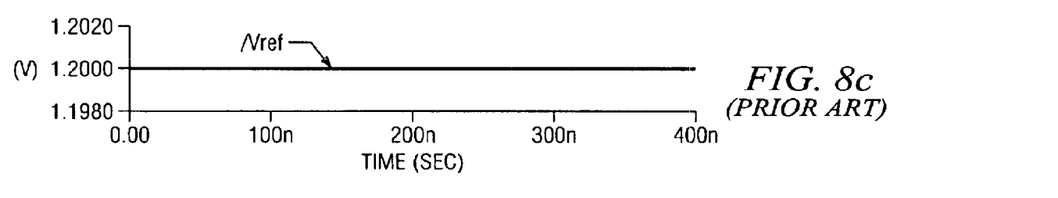
Figure 8D:
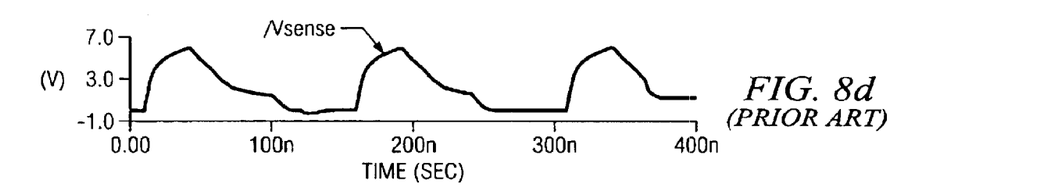
Figure 8E:
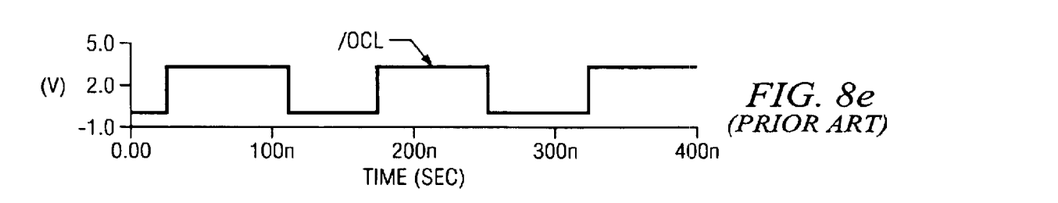

FIGS. 8(a)–(e) comprise the timing diagrams at various nodes in the schematic diagram of FIG. 7. FIG. 8(a) is the control signal at gate 702 of switch 703 of FIG. 7. As seen in FIG. 8(b), a large voltage drop from node 701 and DVSS simulates the spikes due to the reverse recovery of the body diodes. FIG. 8(c) is the band gap reference voltage at a level of 1.2 volts. FIG. 8(d) is the current sense voltage signal "Vsense" at node 707 of the voltage divider of FIG. 7. The voltage signal Vsense is seen to closely track the changes in VDS. The signal of FIG. 8(e) is generated when the signals of FIGS. 8(c) and 8(d) are compared, i.e. the output of the over-current comparator. That is, OCL of FIG. 8(e) is high when the voltage level of Vsense is above Vref. The signal of FIG. 8(e) is the output of the over-current comparator at node 709 of circuit 700 as seen in FIG. 7. When Vsense is lower than the band gap reference voltage Vref, then the output is low, as seen in FIG. 8(e). When Vsense is higher than the band gap reference voltage Vref, even when attributable to the spike of the reverse recovery of the body diode, then the output is high, as seen in FIG. 8(e). This circuit, disadvantageously, is unable to sense and then disregard the spike due to the reverse recovery of the body diode.

Figure 9:
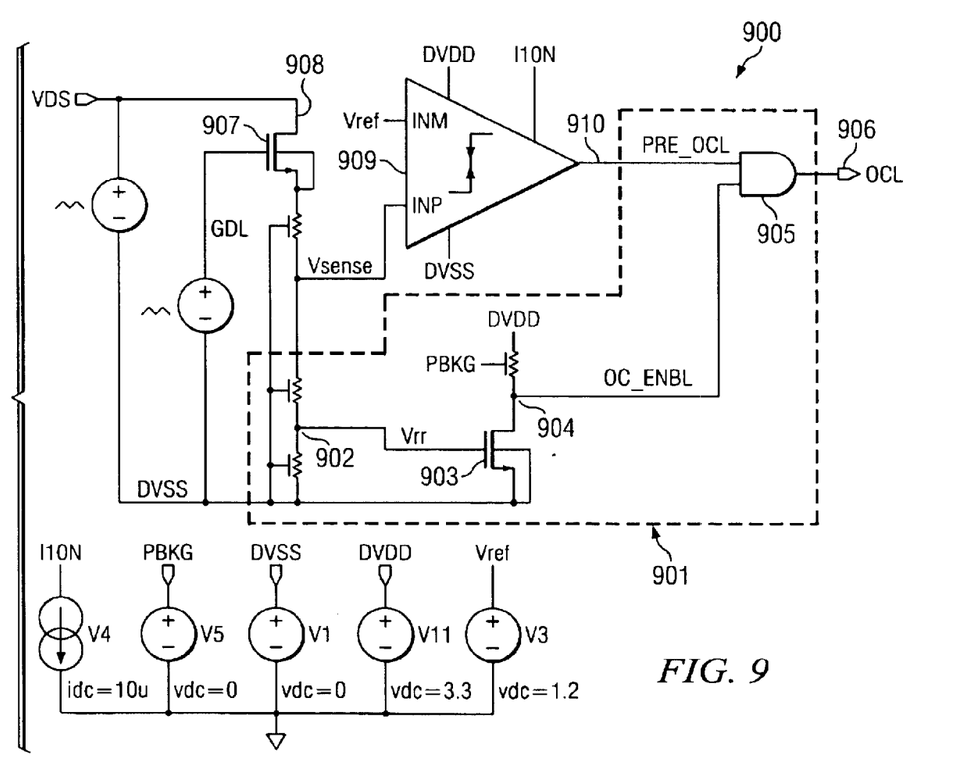
FIG. 9 is a schematic diagram that models a low side switching power output stage with an over-current sense circuit and reverse recovery sense circuit of the present invention.

FIG. 9 illustrates the simulation circuit schematic 900 for low side switching power output stage with an over-current sense circuit and reverse recovery sense circuit of the present invention. Circuit 901 of FIG. 9 comprises the low side reverse recovery sense circuit of the present invention. If Vrr at node 902 is greater than the threshold voltage of switch 903, then the voltage at node 904 will be low, the output at 906 and the output of AND gate 905 will be zero. In this manner, no over-current error signal will be reported to over-current control circuit. Equivalently, the low-side over-current sense circuit is disabled during reverse recovery of the body diode.

Figure 10A:
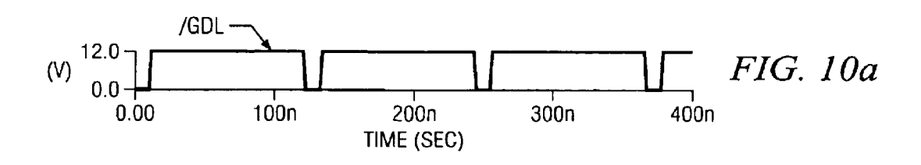
FIGS. 10(a)–(h) comprise waveforms at various nodes in the schematic diagram of FIG. 9 from a spice simulation.
Figure 10B:
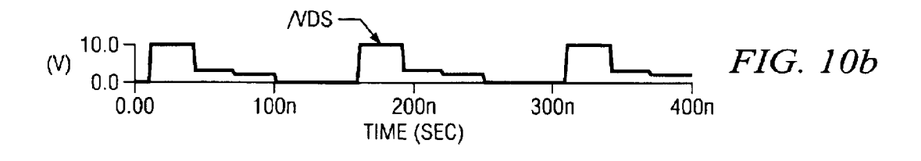
Figure 10C:
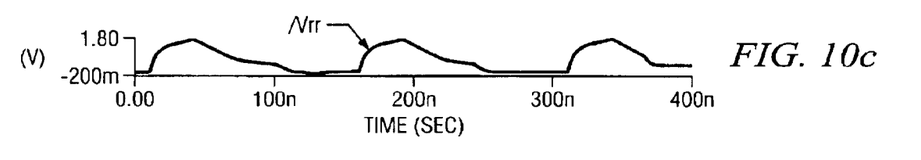
Figure 10D:
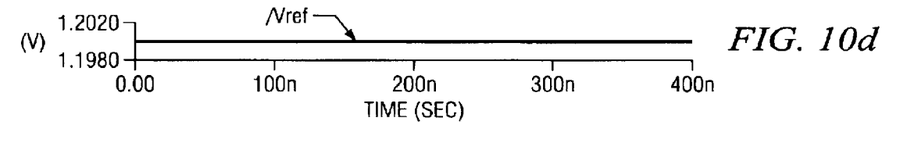
Figure 10E:
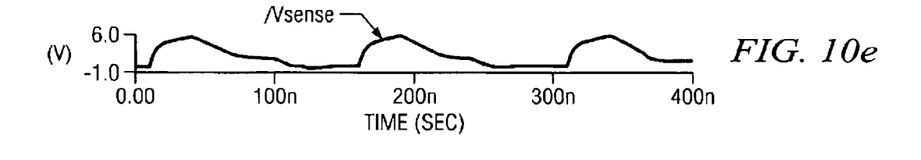
Figure 10F:
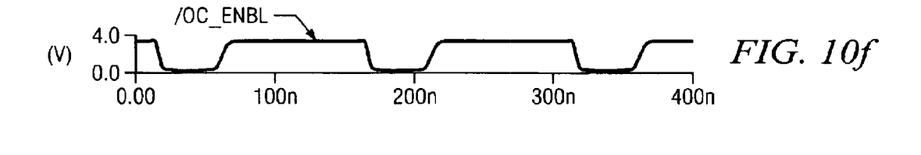
Figure 10G:
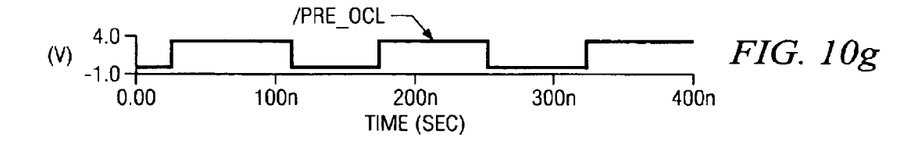
Figure 10H:
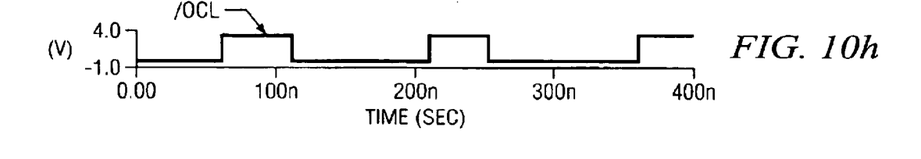

FIGS. 10(a)–(h) comprise timing diagrams of the signals at various nodes in the schematic diagram of FIG. 9. FIG. 10(a) illustrates the control signal at gate 907 of switch 908 of FIG. 9. In FIG. 10(b), a large voltage drop between the node VDS and DVSS simulates the spike caused by the reverse recovery of the body diode. FIG. 10(c) is the sample voltage of VDS ("Vrr"), which is used to control the over-current reporting signal OCL. FIG. 10(d) is the band gap reference voltage at an ideal level of 1.2 volts. FIG. 10(e) is the sample voltage of VDS ("Vsense") for the over-current sense and control purpose. FIG. 10(f) is the signal OC_ENBL at node 904 of FIG. 9. FIG. 10(g) is the output signal of the comparator 909, PRE_OCL at node 910 of FIG. 9. FIG. 10(h) is the signal OCL at the node 906 of FIG. 9. As seen in FIGS. 10(f)–(h), OCL is high only when OCL_ENL and PRE_OCL are both high. When a reverse recovery spike is present, OC_ENBL is low and hence OCL is also low. In this manner, the circuit of the present invention is capable of monitoring over-current in real time without triggering over-current shut-down due to the effects of the reverse recovery of the body diode.

Figure 11:
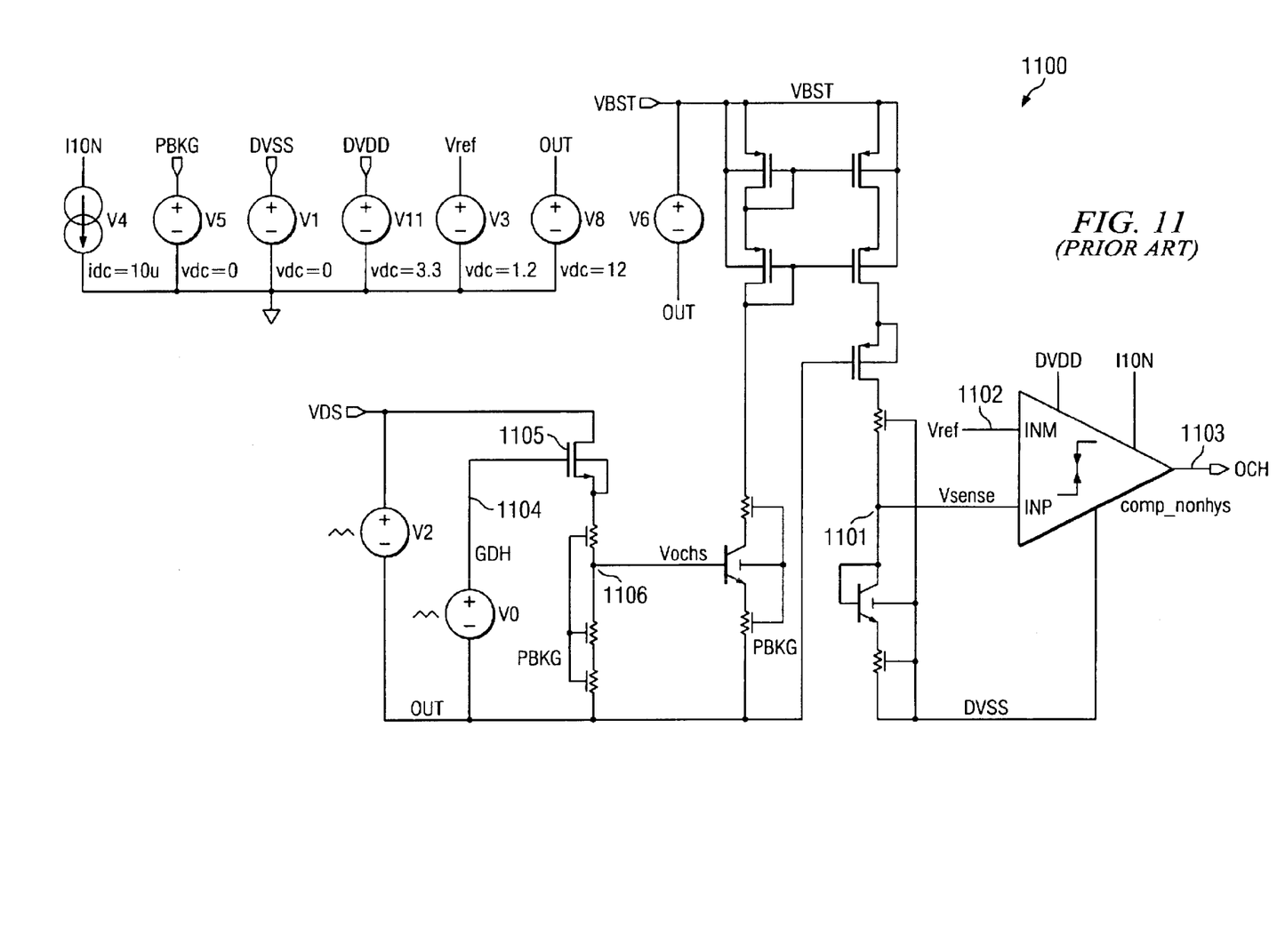
FIG. 11 is a schematic diagram that models a conventional high side switching power output stage with an over-current sense circuit.

FIG. 11 is the schematic diagram that models the conventional high side switching power output stage 1100 with an over-current sense circuit. The operation and effect of the conventional high side circuit is similar to the low side circuit. Disadvantageously, when Vsense at node 1101 is higher than Vref at node 1102, the over-current sense circuit triggers the over-current control circuit, even if the Vsense signal includes the spikes due to the reverse recovery of the body diode.

Figure 12A:
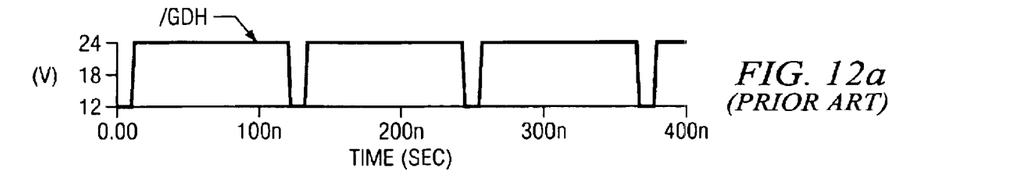
FIGS. 12(a)–(f) comprise waveforms at various nodes in the schematic diagram of FIG. 11 from a spice simulation.
Figure 12B:
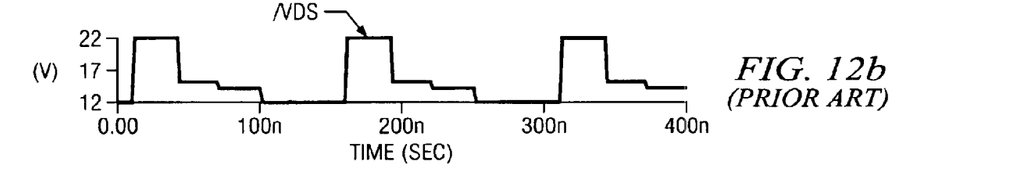
Figure 12C:
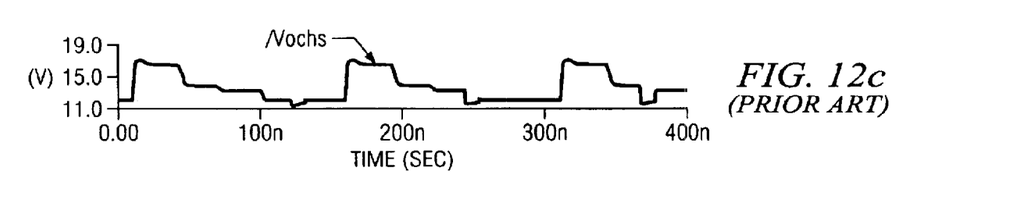
Figure 12D:
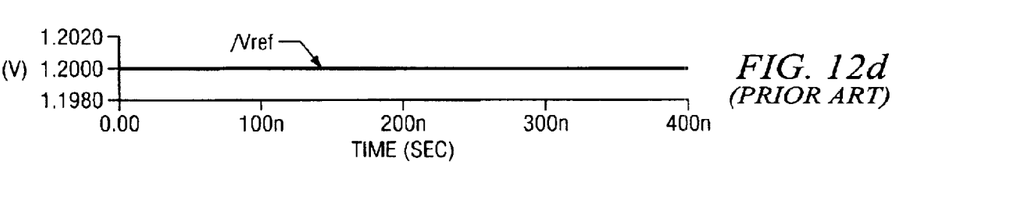
Figure 12E:
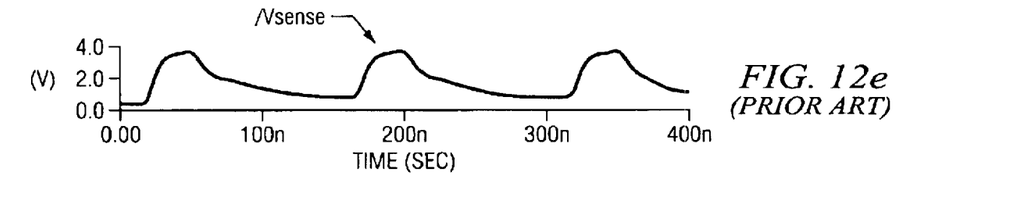
Figure 12F:
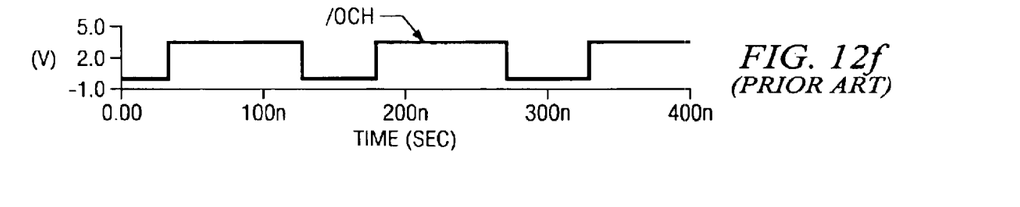

FIGS. 12(a)–(f) comprise timing diagrams at various nodes in the schematic diagram of FIG. 11. FIG. 12(a) illustrates the control signal at gate 1104 of switch 1105 of FIG. 11. In FIG. 12(b), the large voltage drop ("VDS") between node VDS and node OUT emulates the voltage spike of the reverse recovery of the body diode. FIG. 12(c) is the sample voltage of VDS signal ("Vochs") at node 1 106 of FIG. 11, which is used to monitor the output current through high side power switch. FIG. 12(d) is the band gap reference voltage signal at an ideal level of 1.2 volts. FIG. 12(e) is the over-current sense voltage signal ("Vsense") at node 1101, which tracks signal Vochs through a level shifter of FIG. 11. The signal OCH at node 1103 of FIG. 12(f) is the output signal of the comparator. OCH is high when the voltage level of Vsense is above Vref. When Vsense is lower than the band gap reference voltage, then OCH is low, as seen in FIG. 12(f). When the Vsense is higher than the band gap reference voltage, even when attributable to the spike of the reverse recovery of the body diode, then OCH is high, as seen in FIG. 12(f). This circuit, disadvantageously, is unable to sense and then disregard the spike due to the reverse recovery of the body diode.

Figure 13:
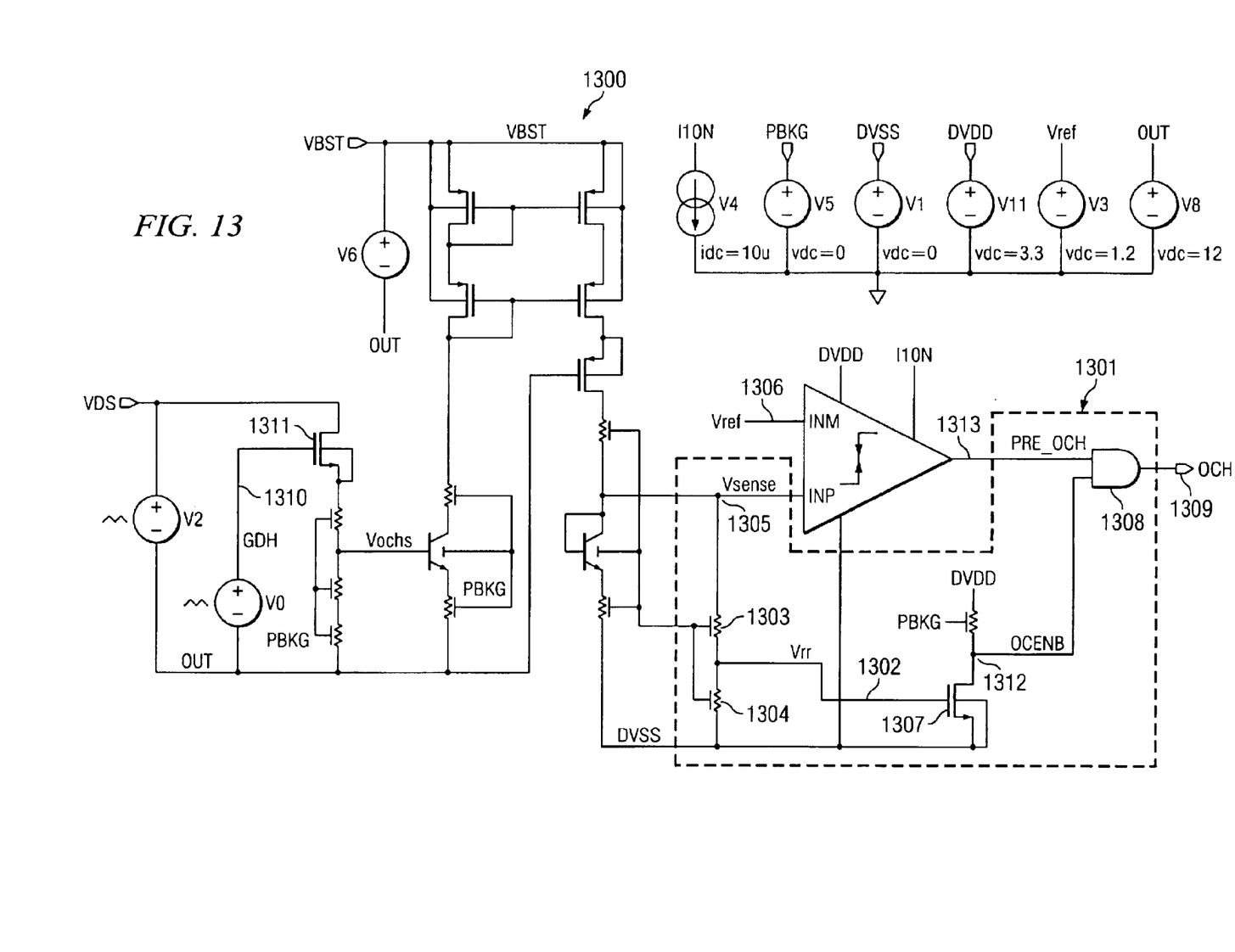
FIG. 13 is a schematic diagram that models a high side switching power output stage with an over-current sense circuit and reverse recovery sense circuit of the present invention.

FIG. 13 is the schematic diagram that models the high side switching power output stage 1300 with an over-current sense circuit and reverse recovery sense circuit of the present invention. Circuit 1301 comprises the high side reverse recovery sense circuit. Resistor 1303 and resistor 1304 comprise a voltage divider circuit. Vsense, at node 1305 is compared with Vref at node 1306, and the comparison result, signal PRE__OCH, goes to one of the inputs of AND gate 1308. The output 1309 of AND gate 1308 is the high-side over-current error reporting signal, which is responsively coupled to the over-current control circuit. Similar to the low side reverse recovery sense circuit of the present invention, the signal at Vrr node 1302 is compared with a threshold voltage Vtn of switch 1307. When the signal Vrr is above Vtn, then the voltage signal OCENB at node 1312 is low and hence, the output 1309 of AND gate 1308 is zero regardless of the PRE__OCH signal level at node 1313. The reverse recovery sense circuit 1301 will turn off the high side over-current control circuit during the reverse recovery of the body diode.

Figure 14A:
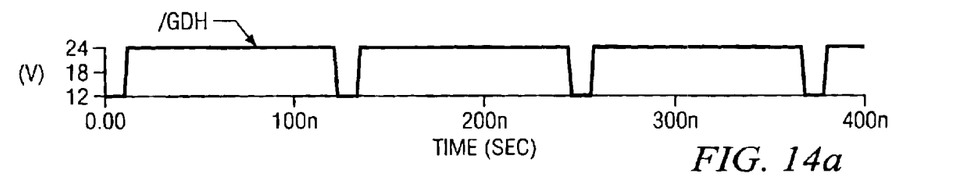
FIGS. 14(a)–(g) comprise waveforms at various nodes in the schematic diagram of FIG. 13 from the spice simulation.
Figure 14B:
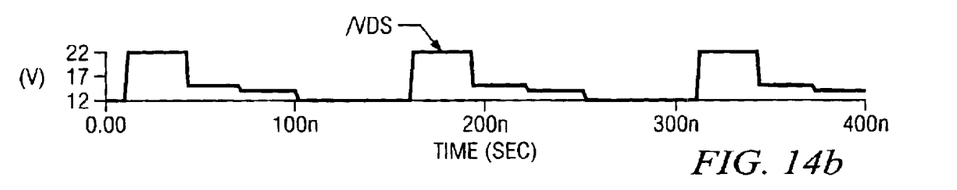
Figure 14C:
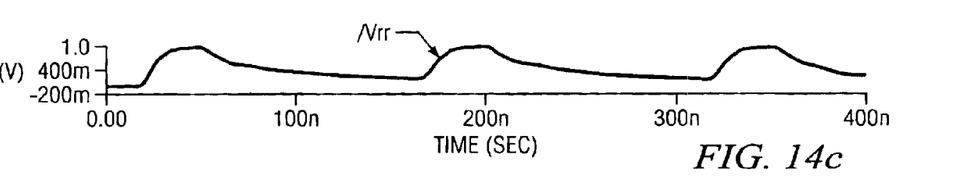
Figure 14D:
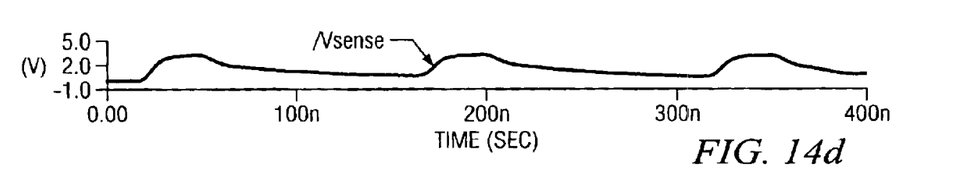
Figure 14E:
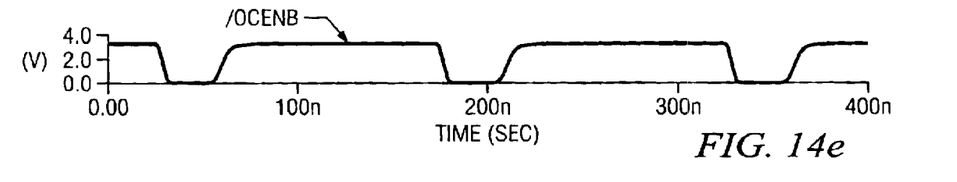
Figure 14F:
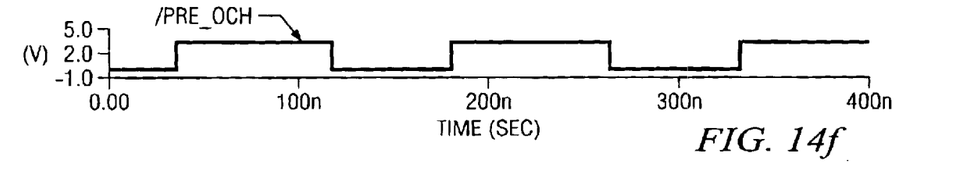
Figure 14G:
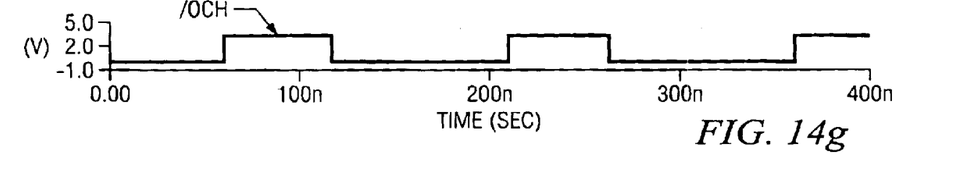

FIGS. 14(a)–(g) comprise timing diagrams at various nodes in FIG. 13. FIG. 14(a) illustrates the control signal at gate 1310 of switch 1311 of FIG. 13. In FIG. 14(b), the large voltage drop between node VDS and node OUT emulates the spike attributable to the reverse recovery of the body diode. FIG. 14(c) is Vrr, the reverse recovery sampling voltage seen at node 1302 of FIG. 13. FIG. 14(d) is Vsense seen at node 1305 of FIG. 13. FIG. 14(e) is the OCENB signal seen at node 1312 of FIG. 13. FIG. 14(f) is the PRE__OCH signal seen at node 1313 of FIG. 13. FIG. 14(g) is the signal output at the OCH node 1309 of Figure 13. As seen in FIGS. 14(c)–(g), OCH is high only when both OCENB and PRE__OCH are high. More specifically, OCENB is high only when Vrr is below a predetermined threshold voltage. When a reverse recovery spike is present, OCENB is low and hence OCH is also low. In this manner, the circuit of the present invention is operable to monitor over-current in real time without triggering due to the reverse recovery of the body diode.

The reverse recovery sense circuit can be implemented because the maximum on-resistance of the power MOS transistor and the maximum normal current through the power MOS transistor are known parameters. Based on those parameters, the maximum voltage drop Von__max across the power switch in the on-state is derived. The reverse recovery sense circuit monitors the voltage drop across the power switch in on-state Von. During reverse recovery period of the body diode, Von is higher than Von__max due to the voltage spike, the over-current sense circuit is then disabled. When reverse recovery is complete, the voltage drop across the power switch decreases below the maximum voltage drop Von__max, and the over-current sense circuit is then enabled and starts to monitor the voltage drop across the power switch in on-state.

The exemplary embodiment of the present invention addresses many of the shortcomings of the prior art. The present invention may be described herein in terms of various functional components. It should be appreciated that such functional components may be realized by any number of hardware or structural components configured to perform the specified functions. For example, the present invention may employ various integrated components which are comprised of various electrical devices, such as resistors, transistors, capacitors, diodes and the like whose values may be suitably configured for various intended purposes. Additionally, the various components may be implemented in alternate ways, such as, for example, the changing of polarity types of transistor devices and the changing of the polarity of the circuits. These alternatives can be suitably selected depending upon the particular application or in consideration of any number of factors associated with the operation of the systems. Such general applications that may be appreciated by those skilled in the art in light of the present disclosure are not described in detail herein. Further, it should be noted that while various components may be suitably coupled or connected to other components within the exemplary circuit, such connections and couplings can be realized either by direct connection between components, or by connection through other components and devices located there between. These and other changes or modifications are intended to be included within the scope of the present invention, as expressed in the following claims.

What is claimed is:

1. A circuit for sensing and controlling current, comprising:
   a power output stage;
   an over-current sense circuit;
   a reverse recovery sense circuit to monitor a reverse recovery period of a body diode including an input at a first voltage sensing node and an output, the first voltage sensing node being adapted to sense a voltage spike to monitor a reverse recovery period of a body diode;
   a logic detection circuit having a first input, a second input and an output, the first input being responsively coupled to the over-current sense circuit and the second input being responsively coupled to the reverse recovery sense circuit;
   the reverse recovery sense circuit being operable to disable the power output stage when a voltage spike occurs during the reverse recovery period;
   the reverse recovery sense circuit being adapted to output a first logic signal when a voltage spike event is occurring during the reverse recovery period and a second logic signal when a voltage spike event is not occurring; and
   the logic detection circuit being operable to reduce the current through the power output stage when an over-current event is occurring and a voltage spike event is not occurring.

2. The circuit for sensing and controlling current of claim 1, further comprising the over-current sense circuit and the reverse recovery sense circuit being operable to cause the logic detection circuit to reduce the power output stage current if and only if (i) the power output stage current exceeds a predetermined current threshold of the power output stage and (ii) the reverse recovery sense circuit does not sense the a voltage spike.

3. The circuit for sensing and controlling current of claim 1, being adapted for use in Class D audio amplifier application.

4. The circuit for sensing and controlling current of claim 1, the reverse recovery sense circuit further comprising:
- a voltage divider circuit operable to modify a voltage level derived from the over-current sense circuit;
- a reverse recovery sense circuit transistor having a gate and an output;
- the modified voltage from the voltage divider circuit being provided to the gate of the reverse recovery sense circuit transistor;
- the reverse recovery sense circuit transistor being operable to compare the modified voltage from the voltage divider to a pre-determined threshold voltage of the reverse recovery sense circuit transistor; and
- the output of the reverse recovery sense circuit transistor being coupled to a the second input of the logic detection circuit.

5. The circuit for sensing and controlling current of claim 1, further comprising:
- the reverse recovery sense circuit being operable to compare a modified voltage signal from the over-current sense circuit to a predetermined threshold voltage signal;
- the reverse recovery sense circuit being operable to use the two voltage signals to identify a pre-determined voltage spike; and
- the output of the reverse recovery sense circuit changing states when the pre-determined voltage spike is identified.

6. A reverse recovery sense circuit, comprising:
- a power output stage;
- a voltage divider circuit operable to accept and modify a first voltage level derived from the power output stage;
- a reverse recovery sense circuit transistor having a gate and an output to monitor a reverse recovery period of a body diode;
- the gate of the reverse recovery sense circuit transistor being operable to accept the modified voltage from the voltage divider circuit;
- the reverse recovery sense circuit transistor being operable to compare the voltage from the voltage divider to a pre-determined threshold voltage of the reverse recovery sense circuit transistor;
- logic detection circuit having a first input, a second input and an output;
- logic detection circuit second input being operable to accept the output from the reverse recovery sense circuit transistor;
- the logic detection circuit second input being operable to accept a second voltage level derived from the power output stage;
- the logic detection circuit output being coupled to an over-current control circuit; and
- the reverse recovery sense circuit being operable to disable the power output stage when a pre-determined voltage spike is sensed during the reverse recovery period.

7. The reverse recovery sense circuit of claim 6 being adapted for use as a Class D amplifier.

8. A method of controlling current through a power output stage, said method comprising:
- obtaining an on-resistance of a switch;
- obtaining a normal current through the switch;
- pre-determining a voltage drop, Von_max, across the switch when the switch is on;
- monitoring a voltage drop Von across the switch with a reverse recovery sense circuit;
- disabling an over-current sense circuit when Von is above the predetermined voltage drop Von_max; and
- reducing the current through the switch when Von is below Von_max and an over current condition is being detected through the power output stage.

9. The method of controlling current through the power output stage of claim 8, further comprising monitoring a reverse recovery period of a body diode.

10. The method of controlling current through the power output stage of claim 8, wherein the power output stage is adapted to be used in a Class D amplifier.

11. The method of controlling current through the power output stage of claim 8, wherein the power output stage is adapted to be used in a digital audio amplifier.

12. The circuit of claim 1, wherein the logic detection circuit comprises an AND gate.

13. The circuit of claim 1, adapted for use on the high side of a power output stage.

14. The circuit of claim 1, adapted for use on the low side of a power output stage.

15. The method of claim 8, adapted for use oh the high side of a power output stage.

16. The method of claim 8, adapted for use on the low side of a power output stage.

* * * * *